US010658523B2

(12) United States Patent
Honda et al.

(10) Patent No.: US 10,658,523 B2
(45) Date of Patent: May 19, 2020

(54) SEMICONDUCTOR DEVICE AND MANUFACTURING METHOD THEREOF

(71) Applicant: Mitsubishi Electric Corporation, Tokyo (JP)

(72) Inventors: Shigeto Honda, Tokyo (JP); Fumihito Masuoka, Tokyo (JP); Yuki Haraguchi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/162,515

(22) Filed: Oct. 17, 2018

(65) Prior Publication Data
US 2019/0157466 A1 May 23, 2019

(30) Foreign Application Priority Data
Nov. 22, 2017 (JP) ................. 2017-224106

(51) Int. Cl.
| | | |
|---|---|---|
| *H01L 29/861* | (2006.01) | |
| *H01L 23/498* | (2006.01) | |
| *H01L 29/06* | (2006.01) | |
| *H01L 29/36* | (2006.01) | |
| *H01L 29/66* | (2006.01) | |
| *H01L 29/16* | (2006.01) | |
| *H01L 29/20* | (2006.01) | |

(52) U.S. Cl.
CPC .... *H01L 29/8611* (2013.01); *H01L 23/49811* (2013.01); *H01L 29/0603* (2013.01); *H01L 29/0619* (2013.01); *H01L 29/36* (2013.01); *H01L 29/861* (2013.01); *H01L 29/1608* (2013.01); *H01L 29/2003* (2013.01); *H01L 29/66136* (2013.01); *H01L 2224/48463* (2013.01); *H01L 2224/4911* (2013.01)

(58) Field of Classification Search
CPC . H01L 29/8611; H01L 29/861; H01L 29/868; H01L 29/872
See application file for complete search history.

(56) References Cited

U.S. PATENT DOCUMENTS

| | | | |
|---|---|---|---|
| 2008/0164556 A1* | 7/2008 | Kikuchi | .............. H01L 27/0788 257/481 |
| 2013/0264674 A1* | 10/2013 | Mizushima | ......... H01L 29/0619 257/487 |
| 2014/0070379 A1* | 3/2014 | Ishimaru | ................. H01L 29/36 257/655 |

FOREIGN PATENT DOCUMENTS

| | | |
|---|---|---|
| JP | 2015-213193 A | 11/2015 |
| JP | 2016-162776 A | 9/2016 |

\* cited by examiner

*Primary Examiner* — Jay C Chang
*Assistant Examiner* — Mikka Liu
(74) *Attorney, Agent, or Firm* — Studebaker & Brackett PC

(57) ABSTRACT

The semiconductor device according to the present invention includes: an n-type semiconductor substrate; a p-type anode layer provided in a front surface of the n-type semiconductor substrate; an anode electrode provided on the p-type anode layer; and a wire connected to the anode electrode, the p-type anode layer includes: a $p^+$-type anode layer disposed to include a position right under a portion where the wire is connected; and a $p^-$-type anode layer disposed to exclude the position right under the portion where the wire is connected, and an impurity concentration of the $p^+$-type anode layer is higher than an impurity concentration of the $p^-$-type anode layer.

9 Claims, 4 Drawing Sheets

SEMICONDUCTOR DEVICE AND MANUFACTURING METHOD THEREOF

BACKGROUND OF THE INVENTION

Field of the Invention

The present invention relates to a semiconductor device used for a power module with high breakdown voltage of 600V or more and a method of manufacturing the semiconductor device.

Description of the Background Art

Conventionally, in order to reduce recovery loss $E_{REC}$ and reverse recovery current $I_{rr}$ in a diode, impurity concentration of a p-type anode layer is lowered to reduce injection efficiency of holes serving as carriers to be injected from the p-type anode layer into an n-type cathode layer. In such a technique, at the time of forming the p-type anode layer of the diode it is common to combine a process of implanting boron ions into the surface of a wafer and a process of high-temperature diffusion, so that the p-type anode layer with a low impurity concentration such as boron is made thin.

Also, conventionally, at the time of incorporating a diode chip in a power module, it is common to use a technique in which a diode chip is electrically connected to another component such as an Insulated Gate Bipolar Transistor (IGBT) chip by bonding a wire on an anode electrode formed directly on a p-type anode layer (see Japanese Patent Application Laid-Open No. 2015-213193, for example).

In the case where a foreign substance with high hardness, such as silicon, exists in or on an anode electrode at the time of bonding a wire on the anode electrode, the foreign substance may get caught between the anode electrode and the wire, which causes the surface of a p-type anode layer to be damaged by a crack or the like. This results in deterioration of device characteristics, such as reduction in the breakdown voltage and the breakdown strength of the diode. In addition, the p-type anode layer having a low impurity concentration is susceptible to such a crack. On the other hand, Japanese Patent Application Laid-Open No. 2015-213193 fails to mention any countermeasure against a crack that may occur when a wire is bonded on the anode electrode.

As described above, conventional diodes cannot achieve either reduction in recovery loss $E_{REC}$ and reverse recovery current $I_{rr}$ or suppression of the influence of a crack generated at the time of wire bonding at the same time.

SUMMARY

An object of the present invention is to provide a semiconductor device capable of achieving both of reduction in recovery loss $E_{REC}$ and reverse recovery current $I_{rr}$ and suppression of influence of a crack generated at the time of wire bonding, and a method of manufacturing the semiconductor device.

The semiconductor device according to the present invention includes: an n-type semiconductor substrate; a p-type anode layer provided in a front surface of the n-type semiconductor substrate; an anode electrode provided on the p-type anode layer; and a wire connected to the anode electrode, the p-type anode layer includes: a first p-type anode layer disposed to include a position right under a portion where the wire is connected; and a second p-type anode layer disposed to exclude the position right under the portion where the wire is connected, and an impurity concentration of the first p-type anode layer is higher than an impurity concentration of the second p-type anode layer.

The method of manufacturing a semiconductor device according to the present invention includes the steps of: (a) preparing an n-type semiconductor substrate; (b) forming a p-type anode layer in a front surface of the n-type semiconductor substrate; (c) forming an anode electrode on the p-type anode layer; and (d) connecting a wire to the anode electrode, wherein the p-type anode layer includes: a first p-type anode layer disposed to include a position right under a portion where the wire is connected; and a second p-type anode layer disposed to exclude the position right under the portion where the wire is connected, and wherein an impurity concentration of the first p-type anode layer is higher than an impurity concentration of the second p-type anode layer.

According to the present invention, the semiconductor device includes: an n-type semiconductor substrate; a p-type anode layer provided in a front surface of the n-type semiconductor substrate; an anode electrode provided on the p-type anode layer; and a wire connected to the anode electrode, the p-type anode layer includes: a first p-type anode layer disposed to include a position right under a portion where the wire is connected; and a second p-type anode layer disposed to exclude the position right under the portion where the wire is connected, and an impurity concentration of the first p-type anode layer is higher than an impurity concentration of the second p-type anode layer, which enables achieving both of reduction in the recovery loss $E_{REC}$ and reverse recovery current $I_{rr}$ and suppression of the influence of cracks generated at the time of wire bonding.

According to the present invention, the method of manufacturing a semiconductor device includes the steps of: (a) preparing an n-type semiconductor substrate; (b) forming a p-type anode layer in a front surface of the n-type semiconductor substrate; (c) forming an anode electrode on the p-type anode layer; and (d) connecting a wire to the anode electrode, wherein the p-type anode layer includes: a first p-type anode layer disposed to include a position right under a portion where the wire is connected; and a second p-type anode layer disposed to exclude the position right under the portion where the wire is connected, and wherein an impurity concentration of the first p-type anode layer is higher than an impurity concentration of the second p-type anode layer, which enables achieving both of reduction in the recovery loss $E_{REC}$ and reverse recovery current $I_{rr}$ and suppression of the influence of cracks generated at the time of wire bonding.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
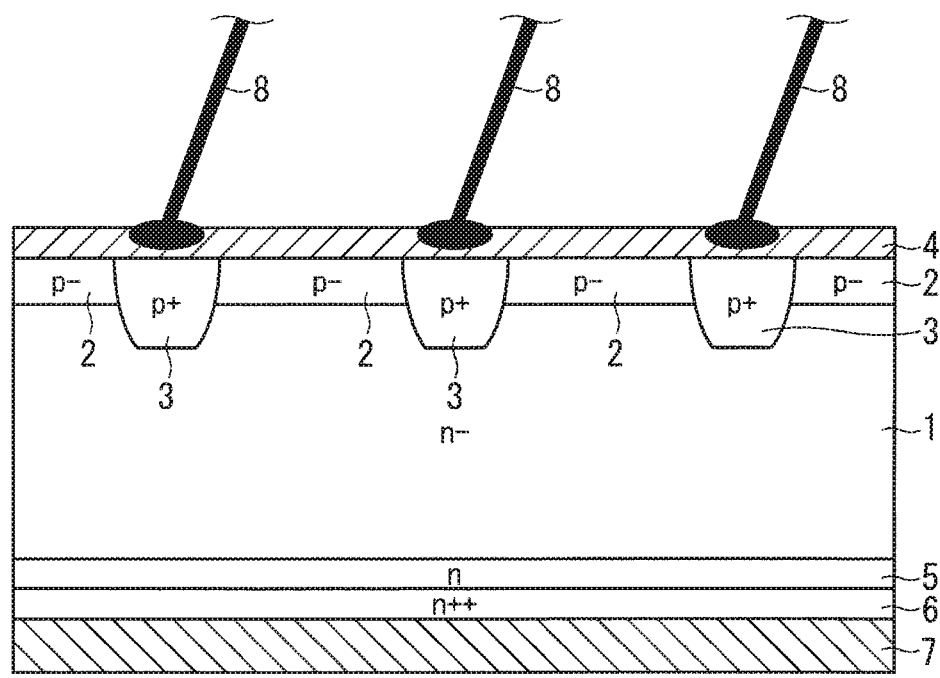
FIG. 1 shows an example of a configuration of a semiconductor device according to a first preferred embodiment of the present invention.

Preferred embodiments of the present invention will be described below with reference to the drawings.

<Conventional Art>

First, a conventional art which is a prerequisite art of the preferred embodiments of the present invention will be described. FIG. 6 shows an example of a configuration of a semiconductor device according to a conventional art. Note that FIG. 6 shows a configuration of a diode as an example of a semiconductor device. In FIG. 6, the surface of each layer directing the upper side of the page is referred to as a "front surface", and the surface of each layer directing the lower side of the page is referred to as a "back surface". These expressions of the "front surface" and the "back surface" are used in the same manner also in FIGS. 1 to 5 described below.

The front surface of an n-type semiconductor substrate 1 is entirely provided with a p⁻-type anode layer 2 having a low impurity concentration. The front surface of the p⁻-type anode layer 2 is provided with an anode electrode 4. Wires 8 are bonded to the anode electrode 4.

The back surface of the n-type semiconductor substrate 1 is provided with an n-type buffer layer 5. The back surface of the n-type buffer layer 5 is provided with an n-type cathode layer 6. The back surface of the n-type cathode layer 6 is provided with a cathode electrode 7.

Figure 7:
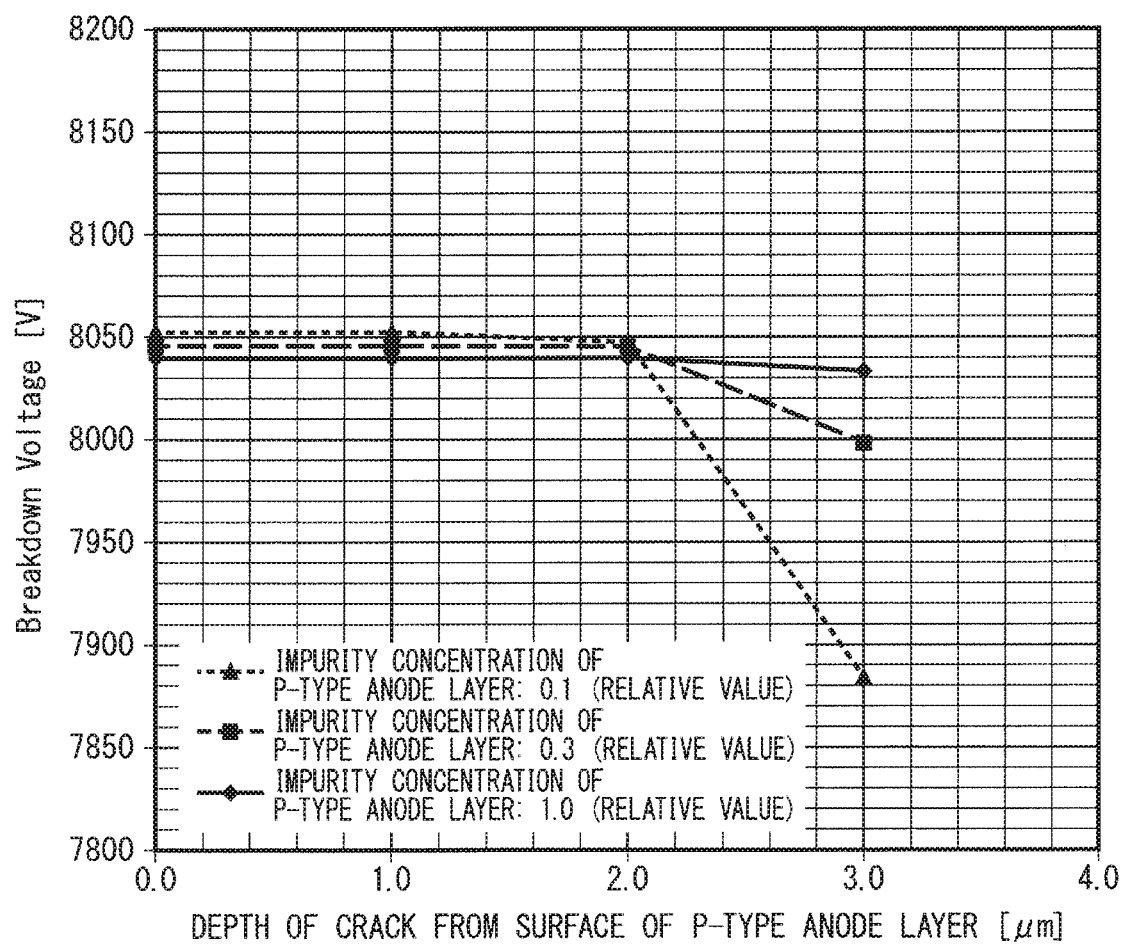
FIG. 7 shows an example of a simulation result of a relationship between a crack depth from a front surface of a p-type anode layer and a breakdown voltage in a diode.

FIG. 7 shows an example of a simulation result of a relationship between a crack depth from a front surface of a p-type anode layer and a breakdown voltage in a 6.5 kV-diode. In FIG. 7, the horizontal axis represents the crack depth (μm) from the front surface of the p-type anode layer and the vertical axis represents breakdown voltage (V).

As shown in FIG. 7, as the impurity concentration of the p-type anode layer decreases, a crack occurring on the front surface of the p-type anode layer at the time of wire bonding greatly affects the device characteristics.

The semiconductor device according to the conventional art shown in FIG. 6 includes the p⁻-type anode layer 2, leading to reduction in recovery loss $E_{REC}$ and reverse recovery current $I_{rr}$. However, the semiconductor device according to the conventional art includes the p⁻-type anode layer 2 at a position right under a portion where each wire 8 is connected, thus being easily affected by a crack generated at the time of wire bonding. Therefore, the semiconductor device according to the conventional art cannot achieve either reduction in recovery loss $E_{REC}$ and reverse recovery current $I_{rr}$ or suppression of influence of a crack generated at the time of wire bonding at the same time. The preferred embodiments of the present invention have been made to solve such a problem, and will be described in detail below.

<First Preferred Embodiment>

FIG. 1 shows an example of a configuration of a semiconductor device according to a first preferred embodiment of the present invention. Note that FIG. 1 shows a configuration of a diode as an example of a semiconductor device.

The front surface of an n-type semiconductor substrate 1 is covered by p⁻-type anode layers 2 which are second p-type anode layers and p⁺-type anode layers 3 which are first p-type anode layers. That is, a p-type anode layer of the semiconductor device shown in FIG. 1 includes the p⁻-type anode layers 2 and the p⁺-type anode layers 3. The impurity concentration of the p⁺-type anode layers 3 is higher than that of the p⁻-type anode layers 2. The thickness of each p⁺-type anode layer 3 is larger than that of the p⁻-type anode layers 2.

An anode electrode 4 is provided on the p⁻-type anode layers 2 and the p⁺-type anode layers 3. Wires 8 are bonded to the anode electrode 4.

The back surface of the n-type semiconductor substrate 1 is provided with an n-type buffer layer 5. The back surface of the n-type buffer layer 5 is provided with an n-type cathode layer 6. The back surface of the n-type cathode layer 6 is provided with a cathode electrode 7.

Specifically, the semiconductor device shown in FIG. 1 is manufactured, for example, by forming a resist pattern on the front surface of the n-type semiconductor substrate 1 by using a photomask. Then, impurities with low concentration are implanted by ion-implantation to form the p⁻-type anode layers 2. Next, the resist pattern is removed, and then another resist pattern is formed by using another photomask, and impurities with high concentration are implanted by ion-implantation to form the p⁺-type anode layers 3. Next, the p⁻-type anode layers 2 and the p⁺-type anode layers 3 are obtained by heat treatment. Next, the anode electrode 4, the n-type buffer layer 5, the n-type cathode layer 6, and the cathode electrode 7 are formed. At this time, well-known techniques may be used to form the anode electrode 4, the n-type buffer layer 5, the n-type cathode layer 6, and the cathode electrode 7. Next, the wires 8 are bonded to the anode electrode 4.

Note that the semiconductor materials used in the semiconductor device according to the first preferred embodiment are not limited to Si, and a wide band gap material, such as SiC or GaN, may be used.

As shown in FIG. 1, the p⁺-type anode layers 3 are provided at positions including right under portions where the wires 8 are respectively connected. Therefore, cracks occur only at the front surfaces of the p⁺-type anode layers 3 at the time of wire bonding, in other words, no cracks occur on the front surfaces of the p⁻-type anode layers 2, thereby suppressing the influence of cracks generated at the time of wire bonding.

In addition, the p⁻-type anode layers 2 are provided to exclude the positions right under the portions where the wires 8 are respectively connected. Therefore, when the p-type anode layer including the p⁻-type anode layers 2 and the p⁺-type anode layers 3 is viewed as a whole, the injection efficiency of carriers into the n-type cathode layer 6 from the p-type anode layer can be reduced, and thus the recovery loss $E_{REC}$c and the reverse recovery current $I_{rr}$ can be reduced.

In view of the above, according to the first preferred embodiment, the p⁺-type anode layers 3 are provided at positions including right under the portions where the wires 8 are respectively connected, and the p⁻-type anode layers 2 are provided to exclude the positions right under the portions where the wires 8 are respectively connected. This enables achieving both of reduction in the recovery loss $E_{REC}$ and the reverse recovery current $I_{rr}$ and suppression of the influence of cracks generated at the time of wire bonding.

<Second Preferred Embodiment>

Figure 2:
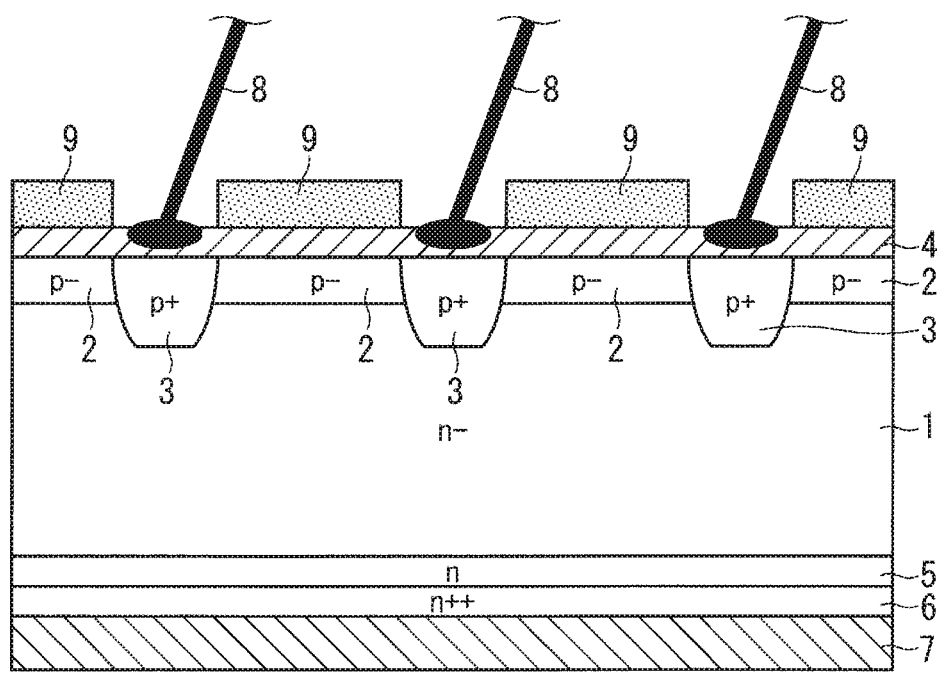
FIG. 2 shows an example of a configuration of a semiconductor device according to a second preferred embodiment of the present invention.

FIG. 2 shows an example of a configuration of a semiconductor device according to a second preferred embodiment of the present invention. Note that FIG. 2 shows a configuration of a diode as an example of a semiconductor device.

As shown in FIG. 2, the semiconductor device according to the second preferred embodiment is characterized in that a glass coating film 9 which is a protective film is provided on the anode electrode 4 and right above the p-type anode layers 2. Since other configurations are the same as those of the semiconductor device according to the first preferred embodiment, detailed descriptions thereof will be omitted.

The difference between the p$^-$-type anode layers 2 and the p$^+$-type anode layers 3 is only the impurity concentration and the thickness. Accordingly, it is difficult to visually distinguish the p$^-$-type anode layers 2 and the p$^+$-type anode layers 3 from each other from the appearance of a diode chip which is a semiconductor device. As shown in FIG. 2, the glass coating film 9 is provided above the p$^-$-type anode layers 2, but is not provided above the p$^+$-type anode layers 3 to have openings. Since the glass coating film 9 is patterned and thus can be distinguished from the appearance of the semiconductor device, the locations of the anode electrode 4 right above the p$^+$-type anode layers 3 can be determined.

As described above, according to the second preferred embodiment, the glass coating film 9 is provided right above the p$^-$-type anode layers 2, but is not provided above the p$^+$-type anode layers 3 to have openings. This configuration prevents the wires 8 from being erroneously bonded to the positions right above the p$^-$-type anode layers 2 where the wires should not be bonded.

<Third Preferred Embodiment>

Figure 3:
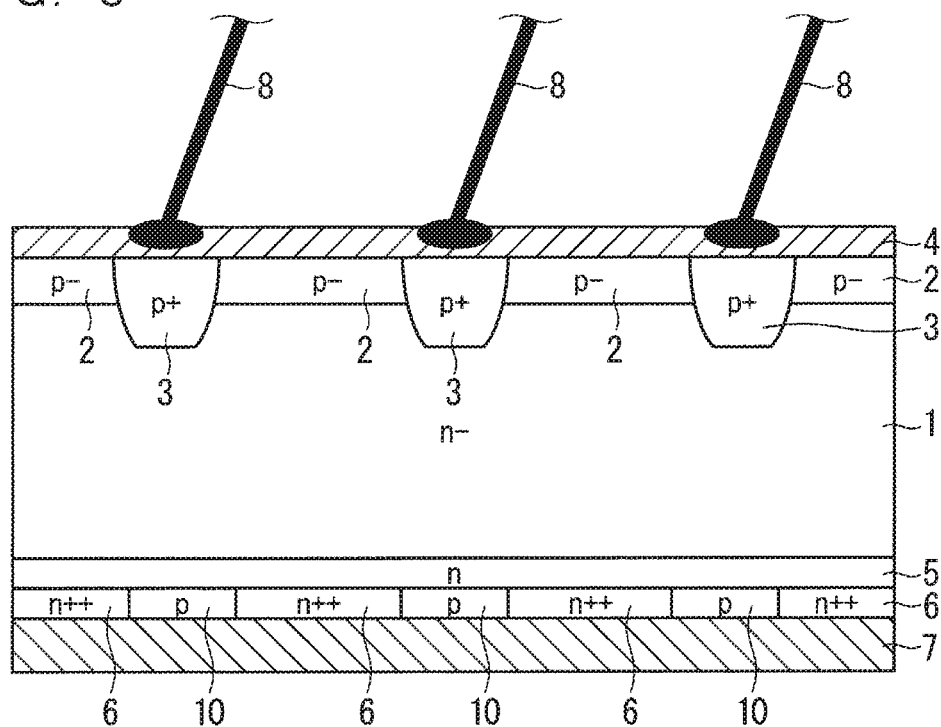
FIG. 3 shows an example of a configuration of a semiconductor device according to a third preferred embodiment of the present invention.

FIG. 3 shows an example of a configuration of a semiconductor device according to a third preferred embodiment of the present invention. Note that FIG. 3 shows a configuration of a diode as an example of a semiconductor device.

As shown in FIG. 3, the semiconductor device according to the third preferred embodiment includes p-type cathode layers 10 provided on the back surface of the n-type semiconductor substrate 1 at positions opposite to the p$^+$-type anode layers 3, and n-type cathode layers 6 provided on the back surface of the n-type semiconductor substrate 1 at positions opposite to the p$^-$-type anode layers 2. Since other configurations are the same as those of the semiconductor device according to the first preferred embodiment, detailed descriptions thereof will be omitted.

The p$^+$-type anode layers 3 that are partially formed in the p-type anode layer have a high impurity concentration, and thus the injection efficiency of carriers in the p$^+$-type anode layers 3 is high due to the high impurity concentration, which weakens the effect of reducing the recovery loss $E_{REC}$ and the reverse recovery current $I_{rr}$. On the other hand, as shown in FIG. 3, the p-type cathode layers 10 are provided at positions opposite to the p$^+$-type anode layers 3. This configuration suppresses injection of electrons that are carriers from the cathode layers, which results in suppression of an increase in the recovery loss $E_{REC}$ and the reverse recovery current $I_{rr}$ due to the p$^+$-type anode layers 3.

As described above, according to the third preferred embodiment, the p-type cathode layers 10 that are provided at positions opposite to the p$^+$-type anode layers 3 suppress an increase in the recovery loss $E_{REC}$ and the reverse recovery current $I_{rr}$ due to the p$^+$-type anode layers 3.

The semiconductor device shown in FIG. 3 may further include a glass coating film 9 as shown in FIG. 2. In this case, the same effect as in the second preferred embodiment can be obtained.

<Fourth Preferred Embodiment>

Figure 4:
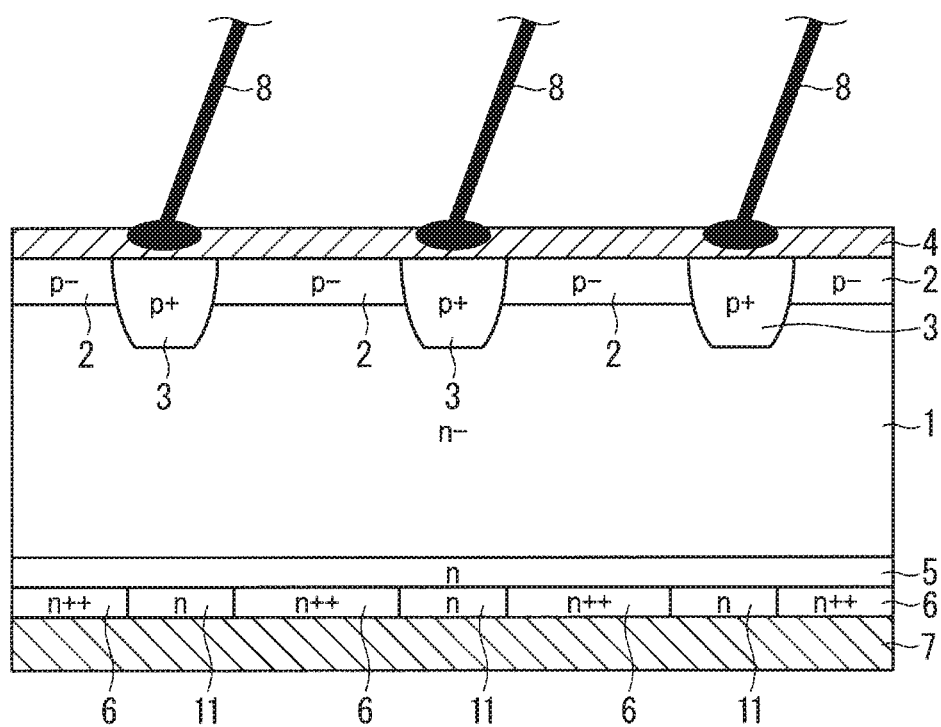
FIG. 4 shows an example of a configuration of a semiconductor device according to a fourth preferred embodiment of the present invention.

FIG. 4 shows an example of a configuration of a semiconductor device according to a fourth preferred embodiment of the present invention. Note that FIG. 4 shows a configuration of a diode as an example of a semiconductor device.

As shown in FIG. 4, the semiconductor device according to the fourth preferred embodiment includes n-type cathode layers 11 which are first n-type cathode layers provided on the back surface of the n-type semiconductor substrate 1 at positions opposite to the p$^+$-type anode layers 3, and n-type cathode layers 6 which are second n-type cathode layers provided on the back surface of the substrate 1 at positions opposite to the p$^-$-type anode layers 2. Since other configurations are the same as those of the first preferred embodiment, detailed descriptions thereof will be omitted.

The impurity concentration of the n-type cathode layers 11 is lower than that of the n-type cathode layers 6. That is, the n-type cathode layers 11 having a low impurity concentration are provided at positions opposite to the p$^+$-type anode layers 3.

As described above, the p$^+$-type anode layers 3 are partially formed in the p-type anode layer and have a high impurity concentration. Thus, the injection efficiency of carriers is increased in the p$^+$-type anode layers 3 due to the high impurity concentration, which weakens the effect of reducing the recovery loss $E_{REC}$ and the reverse recovery current $I_{rr}$. On the other hand, as shown in FIG. 4, the n-type cathode layers 11 having a low impurity concentration are provided at positions opposite to the p$^+$-type anode layers 3. This configuration suppresses injection of electrons serving as carriers from the cathode layers, which results in suppression of the increase in the recovery loss $E_{REC}$ and the reverse recovery current $I_{rr}$ caused by the p$^+$-type anode layers 3.

As described above, according to the fourth preferred embodiment, the n-type cathode layers 11 having a low impurity concentration that are provided at positions opposite to the p$^+$-type anode layers 3 suppress the increase in the recovery loss $E_{REC}$ and the reverse recovery current $I_{rr}$ caused by the p$^+$-type anode layers 3.

The semiconductor device shown in FIG. 4 may further include a glass coating film 9 as shown in FIG. 2. In this case, the same effect as in the second preferred embodiment can be obtained.

<Fifth Preferred Embodiment>

Figure 5:
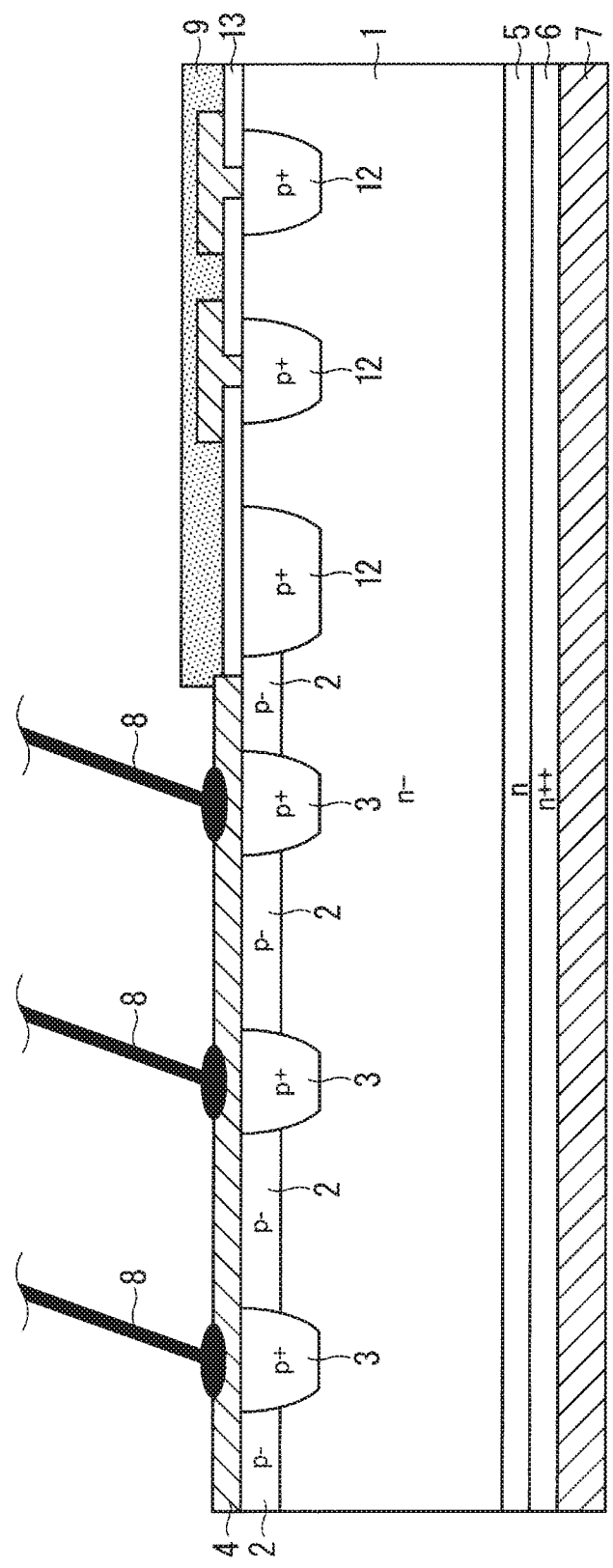
FIG. 5 shows an example of a configuration of a semiconductor device according to a fifth preferred embodiment of the present invention.
Figure 6:
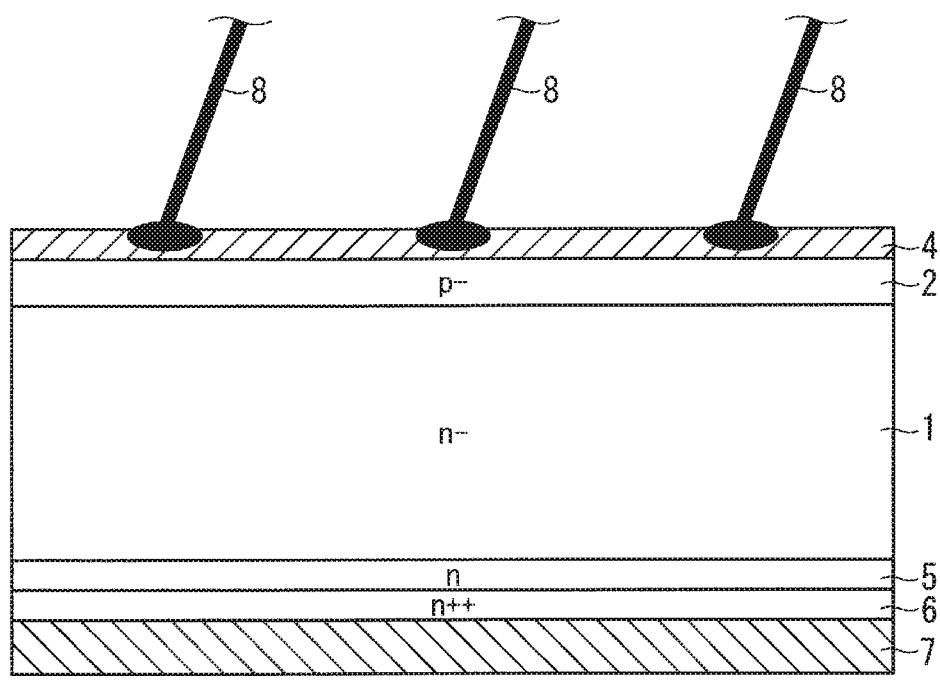
FIG. 6 shows an example of a configuration of a semiconductor device according to a conventional art.

FIG. 5 shows an example of a configuration of a semiconductor device according to a fifth preferred embodiment of the present invention. Note that FIG. 5 shows a configuration of a diode as an example of a semiconductor device.

As shown in FIG. 5, the semiconductor device according to the fifth preferred embodiment is characterized by including a termination region provided on the outer periphery thereof. Since other configurations are the same as those of the semiconductor device according to the first preferred embodiment, detailed descriptions thereof will be omitted.

In order to prevent reduction in breakdown voltage due to concentration of electric field at the termination region, a semiconductor device with a high breakdown voltage includes a structure for maintaining a breakdown voltage such as a guard ring structure in the termination region. In the guard ring structure, a p-type layer having a higher impurity concentration than the p-type anode layer is provided in a ring shape on the outer periphery of the semiconductor device. In general, the p-type layer included in the guard ring structure and the p-type anode layer are formed in separate processes.

The termination region of the semiconductor device according to the fifth preferred embodiment has p$^+$-type guard ring layers 12 provided in the front surface of the n-type semiconductor substrate 1. On the p$^+$-type guard ring layers 12, insulating films 13 and electrodes are provided, and a glass coating film 9 is provided to cover the insulating films 13 and the electrodes. The impurity concentration of the p$^+$-type guard ring layers 12 is the same as that of the p$^+$-type anode layers 3. Further, the thickness of each of the p$^+$-type guard ring layers 12 is the same as the thickness of each of the p$^+$-type anode layers 3. This configuration enables the p$^+$-type guard ring layers 12 and the p$^+$-type anode layers 3 to be formed simultaneously in the same step.

As described above, according to the fifth preferred embodiment, the impurity concentration of the p$^+$-type guard ring layers 12 is the same as that of the p$^+$-type anode layers 3. Further, the thickness of each of the p$^+$-type guard ring layers 12 is the same as the thickness of each of the p$^+$-type anode layers 3. Therefore, the p$^+$-type guard ring layers 12 and the p$^+$-type anode layers 3 can be formed simultaneously in the same step, which prevents an increase in the number of manufacturing steps of a semiconductor device and enables a reduction in manufacturing costs.

Note that FIG. 5 exemplifies the case in which the termination region according to the fifth preferred embodiment is provided in the configuration shown in FIG. 1, but the configuration is not limited thereto. For example, the termination region according to the fifth preferred embodiment may be provided in the configuration shown in any one of FIGS. 2 to 4. In such a case, the same effect as in any one of the second to the fourth preferred embodiments can be obtained.

It should be noted that the present invention also includes free combination of the preferred embodiments as well as appropriate modification of and removal from the preferred embodiments within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
an n-type semiconductor substrate;
a p-type anode layer provided in a front surface of the n-type semiconductor substrate;
an anode electrode provided on the p-type anode layer; and
a plurality of wires each connected to the anode electrode, wherein
the p-type anode layer includes:
a plurality of first p-type anode layers each disposed in a position right under a portion where a respective one of the plurality of wires is connected; and
a plurality of second p-type anode layers each disposed between respective ones of the plurality of first p-type anode layers to exclude positions right under portions where each of the wires is connected, and
an impurity concentration of the first p-type anode layers is higher than an impurity concentration of the second p-type anode layers.

2. The semiconductor device according to claim 1, wherein a thickness of the first p-type anode layers is greater than a thickness of the second p-type anode layers.

3. The semiconductor device according to claim 1, further comprising a protective film provided right above the second p-type anode layers.

4. The semiconductor device according to claim 1, further comprising:
a p-type cathode layer provided in a back surface of the n-type semiconductor substrate and opposed to the first p-type anode layers; and
an n-type cathode layer provided in the back surface of the n-type semiconductor substrate and opposed to the second p-type anode layers.

5. A semiconductor device comprising:
an n-type semiconductor substrate;
a p-type anode layer provided in a front surface of the n-type semiconductor substrate;
an anode electrode provided on the p-type anode layer; and
a wire connected to the anode electrode, wherein
the p-type anode layer includes:
a first p-type anode layer disposed to include a position right under a portion where the wire is connected; and
a second p-type anode layer disposed to exclude the position right under the portion where the wire is connected,
a first n-type cathode layer is provided in a back surface of the n-type semiconductor substrate and opposed to the first p-type anode layer,
a second n-type cathode layer is provided in the back surface of the n-type semiconductor substrate and opposed to the second p-type anode layer, and
an impurity concentration of the first n-type cathode layer is lower than an impurity concentration of the second n-type cathode layer.

6. The semiconductor device according to claim 1, further comprising
a termination region provided on an outer periphery of the semiconductor device, wherein
the termination region has a guard ring layer provided in a front surface of the n-type semiconductor substrate,
an impurity concentration of the guard ring layer is equal to an impurity concentration of the first p-type anode layers, and
a thickness of the guard ring layer is equal to a thickness of the first p-type anode layers.

7. The semiconductor device according to claim 5, wherein
the first n-type cathode layer and the second n-type cathode layer are adjacent in plan view.

8. A method of manufacturing a semiconductor device, the method comprising the steps of:
(a) preparing an n-type semiconductor substrate;
(b) forming a p-type anode layer in a front surface of the n-type semiconductor substrate;
(c) forming an anode electrode on the p-type anode layer; and
(d) connecting a plurality of wires to the anode electrode, wherein the p-type anode layer includes:
a plurality of first p-type anode layers each disposed in a position right under a portion where a respective one of the plurality of wires is connected; and
a plurality of second p-type anode layers each disposed between respective ones of the plurality of first p-type anode layers to exclude positions right under portions where each of the wires is connected, and an impurity concentration of the first p-type anode layers is higher than an impurity concentration of the second p-type anode layers.

9. A semiconductor device comprising:

an n-type semiconductor substrate;

a p-type anode layer provided in a front surface of the n-type semiconductor substrate;

an anode electrode provided on the p-type anode layer;

a wire connected to the anode electrode;

the p-type anode layer including:
- a first p-type anode layer disposed to include a position right under a portion where the wire is connected; and
- a second p-type anode layer disposed to exclude the position right under the portion where the wire is connected;

a p-type cathode layer provided in a back surface of the n-type semiconductor substrate and opposed to the first p-type anode layer; and an n-type cathode layer provided in the back surface of the n-type semiconductor substrate and opposed to the second p-type anode layer, wherein an impurity concentration of the first p-type anode layer is higher than an impurity concentration of the second p-type anode layer.

* * * * *